United States Patent
You et al.

(10) Patent No.: US 11,592,491 B2
(45) Date of Patent: Feb. 28, 2023

(54) BATTERY STATE ESTIMATION METHOD AND APPARATUS

(71) Applicant: Samsung Electronics Co., Ltd., Suwon-si (KR)

(72) Inventors: Kaeweon You, Hwaseong-si (KR); Jeonghyun Park, Seoul (KR); Jinho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 236 days.

(21) Appl. No.: 16/886,967

(22) Filed: May 29, 2020

(65) Prior Publication Data

US 2021/0190866 A1 Jun. 24, 2021

(30) Foreign Application Priority Data

Dec. 23, 2019 (KR) .................. 10-2019-0173248

(51) Int. Cl.
*G01R 31/367* (2019.01)
*G01R 31/36* (2020.01)
*G01R 31/392* (2019.01)
*G01R 31/3842* (2019.01)

(52) U.S. Cl.
CPC ....... *G01R 31/367* (2019.01); *G01R 31/3648* (2013.01); *G01R 31/3842* (2019.01); *G01R 31/392* (2019.01)

(58) Field of Classification Search
CPC ............. G01R 31/367; G01R 31/3648; G01R 31/3842; G01R 31/392
USPC ........................................... 320/132
See application file for complete search history.

(56) References Cited

U.S. PATENT DOCUMENTS

| 8,548,762 | B2 | 10/2013 | Prada et al. | |
| 9,600,581 | B2 | 3/2017 | Chu et al. | |
| 2006/0212277 | A1* | 9/2006 | Hansen | G01R 31/367 |
| | | | | 703/2 |
| 2010/0211568 | A1 | 8/2010 | Chu et al. | |
| 2011/0054816 | A1 | 3/2011 | Prada et al. | |
| 2018/0095140 | A1* | 4/2018 | Park | G01R 31/367 |

(Continued)

FOREIGN PATENT DOCUMENTS

| CN | 109409614 A | 3/2019 |
| JP | 5474713 B2 | 4/2014 |

(Continued)

OTHER PUBLICATIONS

Cai, Long, "An Efficient Electrochemical-Thermal Model for a Lithium-Ion Cell by Using the Proper Orthogonal Decomposition Method", *Journal of the Electrochemical Society*, vol. 157, No. 11, 2010 (9 pages in English).

(Continued)

*Primary Examiner* — Paul Dinh
(74) *Attorney, Agent, or Firm* — NSIP Law

(57) ABSTRACT

A battery state estimation method includes acquiring an initial value of a vector-type parameter for modeling an electrochemical-thermal (ECT) model of a battery, extracting a predetermined point from the vector-type parameter based on the initial value, generating a target parameter based on the predetermined point, to minimize an error between an actual state of the battery and a state of the battery acquired from the ECT model, and estimating the state of the battery based on the target parameter.

31 Claims, 11 Drawing Sheets

(56) References Cited

U.S. PATENT DOCUMENTS

2018/0292465 A1* 10/2018 Osara ................. G01N 33/2888
2021/0359347 A1* 11/2021 Stefanopoulou ..... G01R 31/392

FOREIGN PATENT DOCUMENTS

| JP | 2019-79794 A | 5/2019 |
| KR | 10-1846690 B1 | 5/2018 |
| KR | 10-2018-0082936 A | 7/2018 |

OTHER PUBLICATIONS

Chen, Long, et al., "Electrochemical Model Parameter Identification of Lithium-Ion Battery with Temperature and Current Dependence." *Int. J. Electrochem. Sci*, 14, 2019 (pp. 4124-4143).

* cited by examiner

BATTERY STATE ESTIMATION METHOD AND APPARATUS

CROSS-REFERENCE TO RELATED APPLICATIONS

This application claims the benefit under 35 USC § 119(a) of Korean Patent Application No. 10-2019-0173248, filed on Dec. 23, 2019, in the Korean Intellectual Property Office, the entire disclosure of which is incorporated herein by reference for all purposes.

BACKGROUND

1. Field

The following description relates to a battery state estimation method and apparatus.

2. Description of Related Art

An electrochemical-thermal (ECT) model that mimics a battery includes dozens to hundreds of parameters based on a transformation of a model. To optimize parameters of the ECT model, various off-the-shelf algorithms are employed, and a genetic algorithm (GA) and a particle swam optimization (PSO) are typically utilized. The above algorithms are used to minimize a voltage estimation error of the ECT model.

Although various optimization algorithms are applied, most of diffusion parameters corresponding to anodes and/or cathodes are optimized by modeling as one-dimensional scalar.

However, since a value of a diffusion parameter varies depending on a stoichiometry value of an anode and/or a cathode, it is difficult to accurately estimate a voltage in response to an increase in dynamics of a current flowing in a battery.

Thus, there is a desire for a technology of extending a parameter of an ECT model to a multidimensional vector.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery state estimation method including acquiring an initial value of a vector-type parameter for modeling an electrochemical-thermal (ECT) model of a battery, extracting a predetermined point from the vector-type parameter based on the initial value, generating a target parameter based on the predetermined point, the target parameter minimizing an error between an actual state of the battery and a state of the battery acquired from the ECT model, and estimating the state of the battery based on the target parameter.

A dimension of the vector-type parameter may be based on a stoichiometry of an electrode during charging and discharging of the battery.

The extracting of the predetermined point may include extracting the predetermined point based on a value obtained by differentiating the vector-type parameter at least once with respect to a stoichiometry.

The extracting of the predetermined point based on the value obtained by differentiating the vector-type parameter at least once with respect to the stoichiometry may include extracting a point at which the value obtained by differentiating the vector-type parameter at least once may be a predetermined value.

The predetermined value may be zero.

The generating of the target parameter may include setting a search boundary of a component of the vector-type parameter, and generating the target parameter based on the search boundary.

The setting of the search boundary may include setting the search boundary based on a gradient for a stoichiometry of the component of the vector-type parameter.

The generating of the target parameter may include acquiring the state of the battery from the ECT model using a parameter corresponding to the predetermined point, calculating the error between the actual state of the battery and the state of the battery acquired from the ECT model, and generating the target parameter to minimize the error.

The generating of the target parameter to minimize the error may include generating a set of parameters for the ECT model, generating a candidate parameter based on the set of the parameters, and determining the candidate parameter as the target parameter, in response to an error calculated based on the candidate parameter being minimized.

The error may include a sum of squared errors (SSE) between the actual state of the battery and the state of the battery acquired from the ECT model, for each of a plurality of points in time.

The estimating of the state of the battery may include interpolating a parameter corresponding to each of points other than the predetermined point based on the target parameter, and estimating the state of the battery based on the interpolated parameter.

The state of the battery may include a voltage of the battery with respect to a current and a temperature.

In another general aspect, there is provided a battery state estimation apparatus including a processor configured to acquire an initial value of a vector-type parameter for modeling of an electrochemical-thermal (ECT) model of a battery, extract a predetermined point from the vector-type parameter based on the initial value, generate a target parameter based on the predetermined point, the target parameter minimizing an error between an actual state of the battery and a state of the battery acquired from the ECT model, and estimate the state of the battery based on the target parameter.

A dimension of the vector-type parameter may be based on a stoichiometry of an electrode during charging and discharging of the battery.

The processor may be configured to extract the predetermined point based on a value obtained by differentiating the vector-type parameter at least once with respect to a stoichiometry.

The processor may be configured to extract a point at which the value obtained by differentiating the vector-type parameter at least once is a predetermined value.

The predetermined value may be zero.

The processor may be configured to set a search boundary of a component of the vector-type parameter, and generate the target parameter based on the search boundary.

The processor may be configured to set the search boundary based on a gradient for a stoichiometry of the component of the vector-type parameter.

The battery state estimation apparatus of claim 14, wherein the processor may be configured to acquire the state of the battery from the ECT model using a parameter corresponding to the predetermined point, calculate the error between the actual state of the battery and the state of the battery acquired from the ECT model, and generate the target parameter to minimize the error.

The processor may be configured to generate a set of parameters for the ECT model, generate a candidate parameter based on the set of the parameters, and determine the candidate parameter as the target parameter, in response to an error calculated based on the candidate parameter being minimized.

The error may include a sum of squared errors (SSE) between the actual state of the battery and the state of the battery acquired from the ECT model, for each of a plurality of points in time.

The processor may be configured to interpolate a parameter corresponding to each of points other than the predetermined point based on the target parameter, and estimate the state of the battery based on the interpolated parameter.

The state of the battery may include a voltage of the battery with respect to a current and a temperature.

The battery state estimation apparatus may include a memory configured to store the electrochemical-thermal (ECT) model and instructions executed by the processor to configure the processor to acquire an initial value, to extract the predetermined point, to generate the target parameter, and to estimate the state of the battery.

In another general aspect, there is provided a battery state estimation apparatus including a sensor configured to measure an actual state of the battery, a memory configured to store the actual sate of the battery, and a processor-implemented optimizer configured to acquire an initial value of a vector-type parameter for modeling of an electrochemical-thermal (ECT) model of a battery, extract a predetermined point from the vector-type parameter based on the initial value, generate a target parameter based on the predetermined point, the target parameter minimizing an error between the actual state of the battery and a state of the battery acquired from the ECT model, and store the target parameter in a parameter buffer, and the parameter buffer being configured to output the target parameter to the ECT model to estimate the state of the battery.

The state of the battery acquired from the ECT model is a determined state of the battery, in response to the error being lesser than a threshold.

Other features and aspects will be apparent from the following detailed description, the drawings, and the claims.

Figure 1:
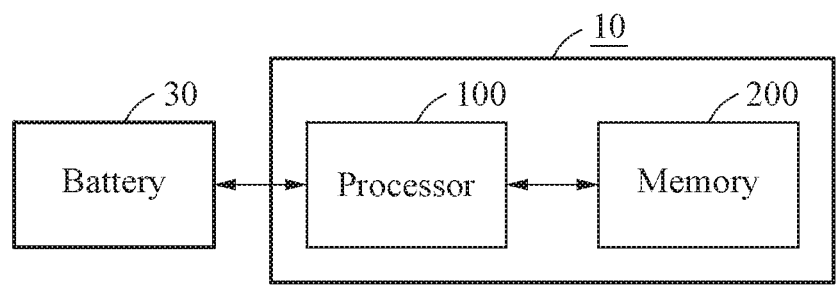
FIG. 1 illustrates an example of a battery state estimation apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinafter, examples will be further described with reference to the accompanying drawings. The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Terms used herein are to merely explain examples, not meant to limit the scope of the present disclosure. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure. In addition, terms such as first, second, A, B, (a), (b), and the like may be used herein to describe components. Each of these terminologies is not used to define an essence, order, or sequence of a corresponding component but used merely to distinguish the corresponding component from other component(s).

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Regarding the reference numerals assigned to the elements in the drawings, it should be noted that the same elements will be designated by the same reference numerals, wherever possible, even though they are shown in different drawings. Also, in describing of examples, detailed description of well-known related structures or functions will be omitted when it is deemed that such description will cause ambiguous interpretation of the present disclosure. FIG. 1 illustrates an example of a battery state estimation apparatus 10.

Referring to FIG. 1, the battery state estimation apparatus 10 estimates a state of a battery 30. The battery 30 converts chemical energy into electricity, stores the electricity and generates a current to supply power to an electric device.

The battery state estimation apparatus 10 estimates the state of the battery 30 using an electrochemical-thermal (ECT) model. The state of the battery 30 includes a voltage of the battery 30 with respect to a current and a temperature. Also, the state of the battery 30 includes, for example, a state of charge (SOC), a state of health (SOH), and a state of charge (SOC) of the battery 30.

The ECT model includes a computer information structure that mathematically expresses electrical and chemical reactions occurring in the battery 30. The ECT model performs modeling of physical dynamics of an operation of the battery 30. The ECT model performs a modeling of the battery 30 using various parameters.

The battery state estimation apparatus 10 includes a processor 100 and a memory 200.

The processor 100 processes data stored in the memory 200. The processor 100 executes computer-readable code, for example, software, stored in the memory 200 and instructions caused by the processor 100.

The term "processor," as used herein, may be a hardware-implemented data processing device having a circuit that is physically structured to execute desired operations. For example, the desired operations may include code or instructions included in a program.

The hardware-implemented data processing device may include, but is not limited to, for example, a microprocessor, a processor core, a multi-core processor, a reconfigurable processor, a multicore processor, a multiprocessor, a central processing unit (CPU), a processor core, a multi-core processor, a multiprocessor, an application-specific integrated circuit (ASIC), and a field-programmable gate array (FPGA), a graphics processing unit (GPU), or any other type of multi- or single-processor configuration.

The processor 100 optimizes a parameter of the ECT model of the battery 30 based on an actual state of the battery 30. The processor 100 performs modeling by regarding the parameter of the ECT model as a vector, to minimize an estimation error for the state of the battery 30.

An optimization of a parameter refers to a process of changing a parameter of an ECT model to minimize an error between an actual state of the battery 30 and a state of the battery 30 that is estimated using the ECT model.

The processor 100 acquires an initial value of a vector-type parameter for modeling of the ECT model of the battery 30. The initial value of the vector-type parameter may be acquired through an experiment. In the following description, a parameter may refer to a vector-type parameter.

The battery state estimation apparatus 10 optimizes the ECT model using a vector-type parameter instead of a scalar-type parameter, to enhance an accuracy of an estimation of the state of the battery 30.

In an example, a parameter is represented by a multidimensional vector. The parameter has a dimension based on a stoichiometry of an electrode during charging and discharging of the battery 30. The electrode may include, for example, an anode or a cathode.

In other words, the vector-type parameter may include a parameter for an anode and a cathode during charging of the battery 30 and a parameter for an anode and a cathode during discharging. The vector-type parameter will be further described below with reference to FIG. 3.

The processor 100 extracts a predetermined point from the vector-type parameter based on the acquired initial value. The processor 100 may extract a predetermined point based on a value obtained by differentiating the vector-type parameter at least once with respect to stoichiometry.

The processor 100 extracts a point at which the value obtained by differentiating the vector-type parameter at least once is a predetermined value, as the predetermined point. For example, the predetermined value may be zero.

The processor 100 generates a target parameter based on the extracted point, to minimize an error between the actual state of the battery 30 and a state of the battery 30 acquired from the ECT model.

The processor 100 sets a search boundary of a component of the vector-type parameter. The processor 100 may set a search boundary for a value of a component of a parameter based on the stoichiometry. Also, the processor 100 may set a search boundary based on a gradient for a stoichiometry of a component of a parameter.

The processor 100 generates a target parameter based on the set search boundary. In other words, the optimization of the parameter is performed within the search boundary. By performing the optimization of the parameter within the search boundary, the battery state estimation apparatus 10 reduces a number of operations required for the optimization.

The processor 100 acquires the state of the battery 30 from the ECT model using a parameter corresponding to a predetermined point.

The processor 100 calculates the error between the actual state of the battery 30 and the state of the battery 30 acquired from the ECT model.

The processor 100 generates a target parameter to minimize the error between the actual state of the battery 30 and the state of the battery 30 acquired from the ECT model.

The error includes a sum of squared errors (SSE) between the actual state of the battery 30 and the state of the battery 30 acquired from the ECT model, for each of a plurality of points in time. For example, the processor 100 may calculate errors between the actual state of the battery 30 and the state of the battery 30 acquired from the ECT model, for each of points in time, and may add up squared errors, to obtain the SSE. The error will be further described below with reference to FIG. 2.

The processor 100 generates a set of parameters used in the ECT model. In an example, the processor 100 generates a candidate parameter based on the set of the parameters. An operation of generating a candidate parameter will be further described below with reference to FIG. 2.

When an error that is calculated based on the candidate parameter is minimized, the processor 100 may determine the candidate parameter as a target parameter. For example, when the error between the actual state of the battery 30 and the state of the battery 30 acquired from the ECT model using the candidate parameter is minimized, the processor 100 may determine the candidate parameter as a target parameter.

The processor 100 estimates the state of the battery 30 based on the generated target parameter. In an example, the processor 100 interpolates a parameter corresponding to each of points other than the predetermined point based on the target parameter.

The processor 100 estimates the state of the battery 30 based on the interpolated parameter.

The memory 200 stores instructions or programs executed by the processor 100. For example, instructions may include instructions to perform an operation of the processor 100 and/or an operation of each component of the processor 100.

The memory 200 may be implemented as a volatile memory device or a nonvolatile memory device.

The volatile memory device may be implemented as a dynamic random access memory (DRAM), a static random access memory (SRAM), a thyristor RAM (T-RAM), a zero capacitor RAM (Z-RAM), or a twin transistor RAM (TTRAM).

The nonvolatile memory device may be implemented as an electrically erasable programmable read-only memory (EEPROM), a flash memory, a magnetic RAM (MRAM), a spin-transfer torque (STT)-MRAM, a conductive bridging RAM (CBRAM), a Ferroelectric RAM (FeRAM), a phase-change RAM (PRAM), a resistive RAM (RRAM), a nanotube RRAM, a polymer RAM (PoRAM), a nano-floating gate memory (NFGM), a holographic memory, a molecular electronic memory device, or an insulator resistance change memory. Further details regarding the memory 200 is provided below.

Figure 2:
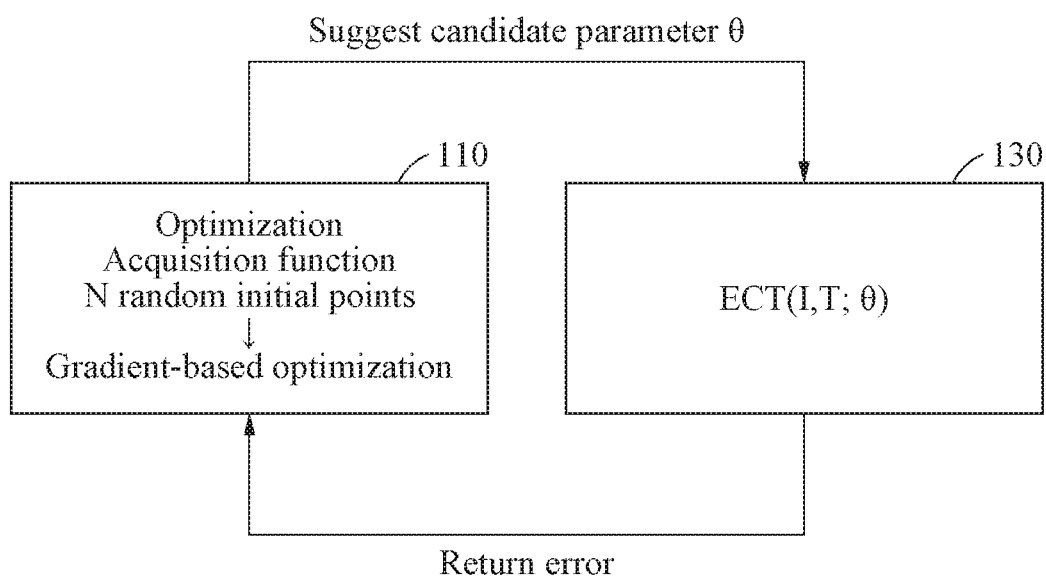
FIG. 2 illustrates an example of an operation of the battery state estimation apparatus of FIG. 1.

FIG. 2 illustrates an example of an operation of the battery state estimation apparatus 10 of FIG. 1.

Referring to FIG. 2, in operation 110, the processor 100 optimizes a vector-type parameter. In operation 130, the processor 100 acquires a state of the battery 30 from an ECT model based on the optimized parameter.

The processor 100 optimizes a parameter using an optimization algorithm and estimates the state of the battery 30 from the ECT model using the optimized parameter, to obtain the state of the battery 30.

The processor 100 generates a target parameter by repeatedly optimizing parameters to minimize an error between the estimated state of the battery 30 and an actual state of the battery 30.

The state of the battery 30 includes a voltage of the battery 30 with respect to a current and a temperature of the battery 30. The current and the temperature include sequence data. In an example, the processor 100 estimates the voltage of the battery 30 with respect to the current and the temperature of the battery 30 using the ECT model.

A result obtained by estimating the state of the battery 30 using the ECT model for an arbitrary parameter $\theta$ with respect to a given current I and temperature T is represented as $ECT(I, T; \theta)$. Hereinafter, an example of a parameter optimization operation of the processor 100 when a state of a battery is a voltage is described. In other words, an example in which $ECT(I, T; \theta)$ is a voltage is described below.

An example of an operation of optimizing a parameter based on a voltage is described with reference to FIG. 2, however, characteristics of the battery 30 other than the voltage may be used as a state of a battery.

The processor 100 calculates an error between $ECT(I, T; \theta)$ that is the estimated state of the battery 30 and the actual state of the battery 30. The error includes a sum of squares error ("SSE") between $ECT(I, T; \theta)$ and the actual state of the battery 30. Depending on examples, the error may be calculated using various calculation methods, for example, a root mean square error (RMSE) or a maximum absolute error (MAE).

The processor 100 receives experimental data associated with a state of the battery 30 measured for an arbitrary current, an arbitrary temperature and an arbitrary voltage. The experimental data is measured based on various profiles of a current, a temperature and a voltage, for an optimization of a parameter.

In an example the experimental data has a form of {I, T, V}. I denotes a current, T denotes a temperature, and V denotes a voltage.

The processor 100 estimates the state of the battery 30 using the ECT model with respect to an arbitrary parameter at least once. The processor 100 generates a set of parameters used in the ECT model. The set of the parameters includes a parameter applied to the ECT model and an error between a state of the battery 30 estimated using the parameter and the actual state of the battery 30.

For example, when the state of the battery 30 is estimated "n" times using the ECT model, a set of parameters may be represented as $S=\{(\theta_1, E_1), (\theta_2, E_2), \ldots (\theta_n, E_n)\}$.

The processor 100 generates a candidate parameter $\theta_{n+1}$ with a highest possibility that an error between the actual state of the battery 30 and a state of the battery 30 acquired from the ECT model is improved or minimized based on the set S of the parameters using an optimization algorithm.

The optimization algorithm includes, for example, a Bayesian optimization (BO) algorithm. The BO algorithm may search for a global optimum using a minimum evaluation.

The processor 100 generates a candidate parameter using an acquisition function. The acquisition function quantifies a degree of an improvement of the error based on the set S of the parameters. The processor 100 performs a gradient-based optimization with respect to the acquisition function, to generate a candidate parameter.

The processor 100 estimates the state of the battery 30 using an ECT model to which the generated candidate parameter is applied. For example, the processor 100 may acquire a state ECT(I, T; $\theta_{n+1}$) of the battery 30 using the candidate parameter $\theta_{n+1}$.

In this example, the processor 100 may calculate an error, for example, an SSE, between ECT(I, T; $\theta_{n+1}$) and the actual state of the battery 30. The processor 100 may add the candidate parameter $\theta_{n+1}$ to a set of parameters and may generate a new candidate parameter.

In an example, the processor 100 repeats a generation of a candidate parameter and a calculation of an error to minimize the error between the actual state of the battery 30 and the state of the battery 30 acquired from the ECT model.

For example, the processor 100 may optimize a parameter by repeating the generation of the candidate parameter and the calculation of the error a predetermined number of times. Also, the processor 100 may repeat the generation of the candidate parameter and the calculation of the error until the error between the actual state of the battery 30 and the state of the battery 30 acquired from the ECT model is less than or equal to a threshold.

Figure 3:
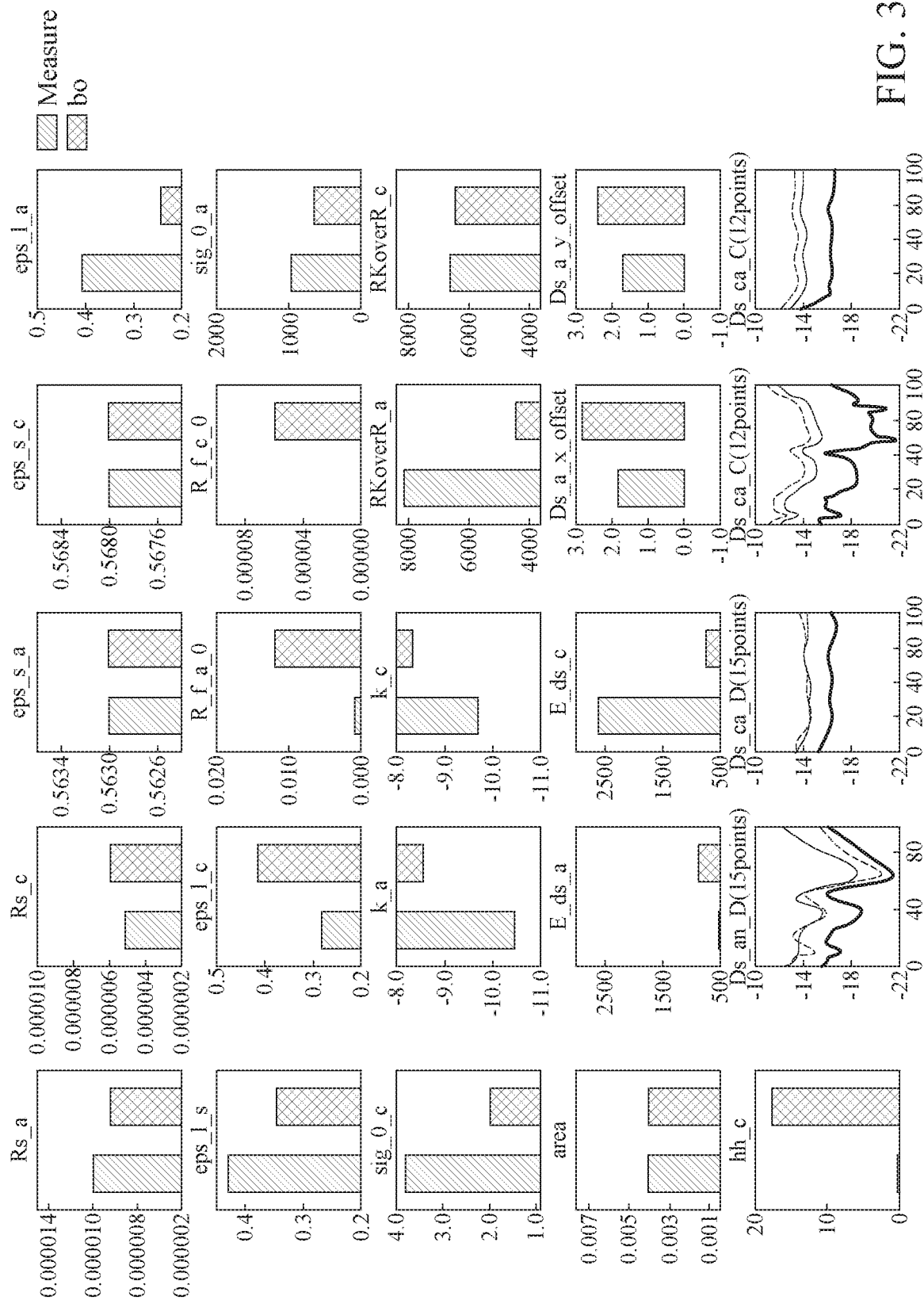
FIG. 3 illustrates examples of parameters for modeling of a battery.

FIG. 3 illustrates examples of parameters for modeling of a battery.

Referring to FIG. 3, as described above, the processor 100 performs modeling of an ECT model using a vector-type parameter. The vector-type parameter includes various components to reflect electrochemical characteristics of the battery 30.

A y-axis of each of bar graphs corresponds to each parameter. In each of the bar graphs, a left bar represents an experimental value and a right bar represents an optimized parameter.

Four graphs shown in the bottom of FIG. 3 are graphs associated with diffusion coefficients. In each of the four graphs, a thick solid line represents an experimental value, and a thin solid line represents an optimization result.

An ECT model includes several tens to hundreds of parameters depending on a type of models. In an ECT model according to a related art, a parameter is regarded as a scalar and modeling of a battery is performed. However, the battery state estimation apparatus 10 constitutes an ECT model by regarding a parameter as a multidimensional vector.

The processor 100 uses vector-type parameters obtained by subdividing a stoichiometry based on charging, discharging, a cathode and an anode. The vector-type parameters may include a temperature, a diffusion parameter and a constant parameter.

In an example, the vector-type parameter may include a diffusion parameter corresponding to an anode during charging and discharging. The diffusion parameter corresponding to the anode may include 101-dimensional parameters obtained by dividing a range of "0" to "100" of the stoichiometry by "1".

In another example, the vector-type parameter may include a diffusion parameter corresponding to a cathode during charging and discharging. The diffusion parameter corresponding to the cathode may include 81-dimensional parameters obtained by dividing a range of 20 to 100 of the stoichiometry by "1".

For example, the diffusion parameter corresponding to the anode during charging and discharging may have "202" dimensions obtained by "101×2", and the diffusion parameter corresponding to the cathode during charging and discharging may have "162" dimensions obtained by "81× 2". The vector-type parameter may have "364" dimensions obtained by adding the "202" dimensions of the diffusion parameter corresponding to the anode and the "162" dimensions of the diffusion parameter corresponding to the cathode.

The vector-type parameter may further include a constant parameter as needed. For example, the constant parameter may include 21-dimensional parameters. In this example, the vector-type parameter may have "385" dimensions obtained by adding the "364" dimensions and "21" dimensions.

Hereinafter, a process of extracting a predetermined point from a vector-type parameter and performing an optimization is described with reference to FIGS. 4 through 6.

Figure 4:
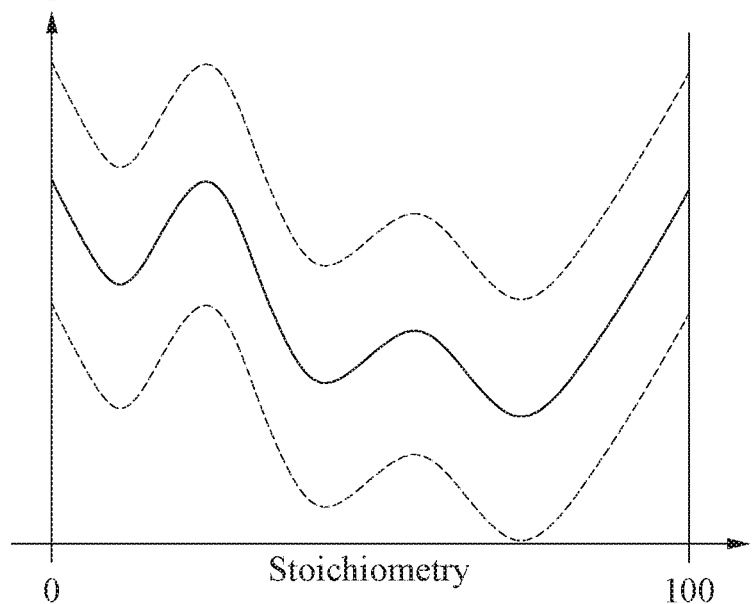
FIG. 4 illustrates an example of an initial value of a parameter of an electrochemical-thermal (ECT) model of a battery.
Figure 5:
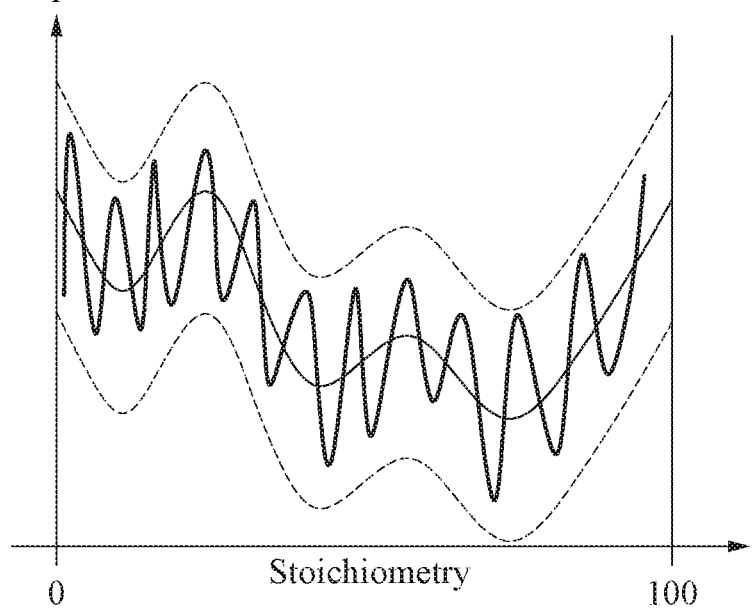
FIG. 5 illustrates an example of a parameter of an ECT model optimized using a naïve optimization scheme by the battery state estimation apparatus of FIG. 1.

FIG. 4 illustrates an example of an initial value of a parameter of an ECT model of a battery, and FIG. 5 illustrates an example of a parameter of an ECT model optimized using a naïve optimization scheme by the battery state estimation apparatus 10 of FIG. 1. FIG. 6 illustrates an example of a parameter of an ECT model optimized by reducing a dimension of the parameter by the battery state estimation apparatus 10.

Figure 6:
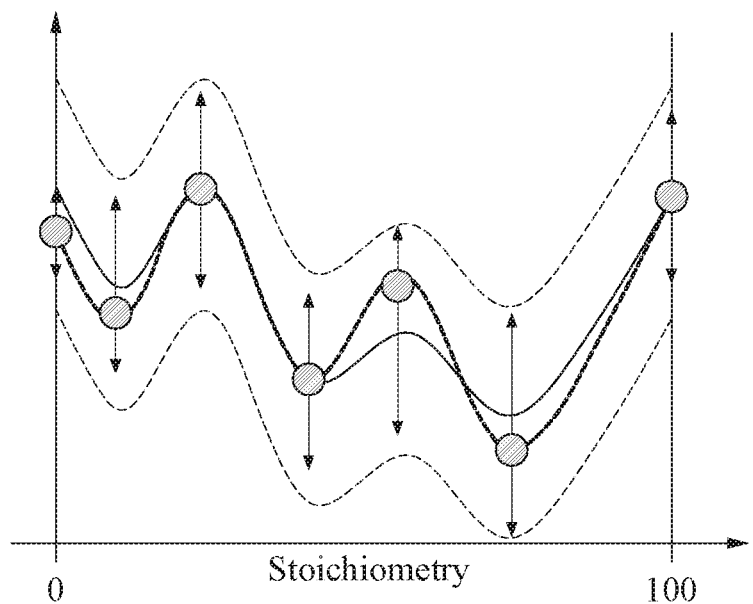
FIG. 6 illustrates an example of a parameter of an ECT model optimized by reducing a dimension of the parameter by the battery state estimation apparatus of FIG. 1.

Referring to FIGS. 4 through 6, the processor 100 extracts a predetermined point from an initial value of a parameter and optimizes the parameter based on the predetermined point.

The processor 100 acquires an initial value of a parameter and a state of the battery 30 acquired through experiments under various conditions of a current, a temperature and a voltage. In FIG. 4, a solid line represents the initial value of the parameter acquired through experiments.

FIG. 4 illustrates an optimization process through a dimension reduction of a parameter corresponding to an anode during discharging, however, examples are not limited thereto. A parameter corresponding to an anode during charging and parameters corresponding to an anode and a cathode during discharging may also be optimized using the same scheme.

The processor 100 sets a search boundary to perform an optimization of the parameter based on the initial value of the parameter. In FIG. 4, a dashed line represents a search boundary.

As shown in FIG. 4, the processor 100 may set a search boundary of the parameter or may set a search boundary based on a gradient for a stoichiometry of the parameter. An example of setting a search boundary based on a gradient will be further described below with reference to FIG. 7.

In the example of FIG. 6, the processor 100 optimizes 101-dimensional vector-type parameters including a diffusion parameter corresponding to an anode during discharging, using a naïve scheme.

The naïve scheme includes a process of performing an optimization of all vector-type parameters. In an optimization scheme of the naïve scheme, the processor 100 performs an optimization by setting a search boundary from the initial value of the parameter as shown in FIG. 4 and changing each component of vectors of all dimensions corresponding to a stoichiometry.

In an example of the diffusion parameter corresponding to the anode during discharging, an optimization may be performed on each of components of the 101-dimensional vector-type parameters. In this example, due to a high dimension of a vector to be optimized, it may be difficult to perform the optimization and an oscillation may occur after the optimization. The oscillation may reduce a validity of physical characteristics of the battery 30 and may cause instability in an estimation of the state of the battery 30 using an ECT model.

To compensate for an optimization of the naïve scheme, the processor 100 may perform an optimization by reducing a dimension of a parameter that needs to be optimized.

The processor 100 extracts a predetermined point from the vector-type parameter and performs an optimization of the predetermined point, instead of optimizing all the points, so that a parameter with a reduced dimension may be optimized.

In the example of FIG. 6, a circle represent a predetermined point extracted by the processor 100. The processor 100 extracts a predetermined point based on a value obtained by differentiating the vector-type parameter at least once with respect to a stoichiometry.

For example, the processor 100 may extract a point at which a value obtained by differentiating the vector-type parameter at least once or twice with respect to the stoichiometry is a predetermined value, as the predetermined point.

The processor 100 extracts a point at which the value obtained by differentiating the vector-type parameter at least once with respect to the stoichiometry is a predetermined value, as the predetermined point. For example, the processor 100 may extract a point at which the value obtained by differentiating the vector-type parameter at least once is zero, as the predetermined point.

In the example of FIG. 6, the processor 100 extracts a point at which a value, for example, a gradient, obtained by differentiating the vector-type parameter with respect to the stoichiometry is zero, as a predetermined point. For example, the processor 100 may extract a point at which a second-order differential value, a third-order differential value or a higher-order differential value is zero as a predetermined point, as needed.

In an example, the processor 100 optimizes parameters corresponding to the predetermined point by performing an optimization of the predetermined point, instead of optimizing entire points. An optimization method may be the same as that of FIG. 2.

In an example, the processor 100 interpolates the optimized parameters corresponding to the predetermined point, and determines components of a parameter corresponding to each of points other than the predetermined point. For example, the processor 100 performs an interpolation using a Gaussian process regression (GPR) scheme as a non-parametric model.

In the example of FIG. 6, the processor 100 extracts seven points, performs an optimization of parameters corresponding to the seven points, and determines a component of a parameter corresponding to each of points other than the seven points through an interpolation. In the example of FIG. 6, 101 dimensions of a parameter are reduced to seven dimensions.

The processor 100 may facilitate the optimization by dealing with a portion of points among multidimensional vector-type parameters. The processor 100 may determine a parameter corresponding to each of points other than the predetermined point through the interpolation, to increase a stability in estimation of the state of the battery 30.

Also, the processor 100 determines components of a parameter corresponding to each of points other than the predetermined point through the interpolation, to ensure a physical validity while maintaining a smoothness of the parameter. Thus, it is possible to secure the stability in estimation of the state of the battery 30.

In comparison to the naïve optimization scheme of FIG. 5, an oscillation of the optimized and interpolated parameters are reduced as shown in FIG. 6.

Figure 7:
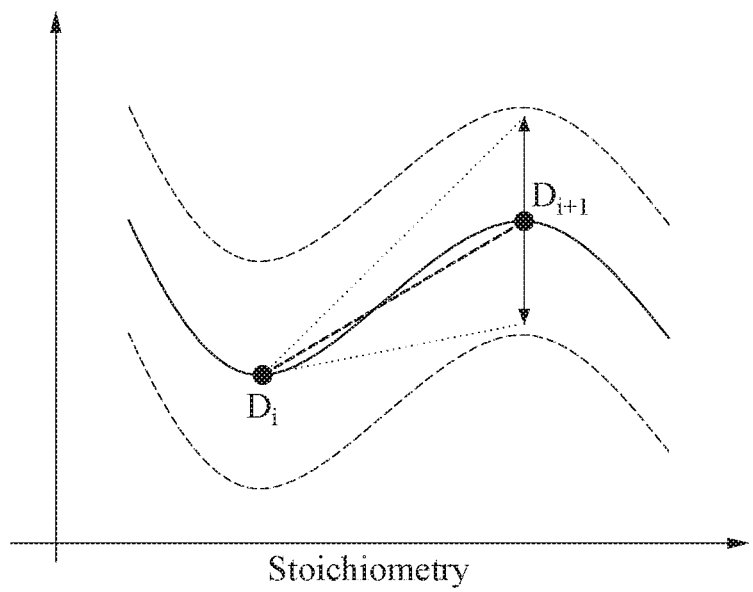
FIG. 7 illustrates an example of an operation of setting a search boundary of a parameter of an ECT model based on a gradient.

FIG. 7 illustrates an example of an operation of setting a search boundary of a parameter of an ECT model based on a gradient.

Referring to FIG. 7, the processor 100 sets a search boundary to efficiently perform an optimization of a parameter. The processor 100 may set a search boundary by limiting a boundary of a component of a vector-type parameter as shown in FIG. 4, or may set a search boundary based on a gradient of the graph of FIG. 4.

In the example of FIG. 7, components of parameters corresponding to predetermined points i and i+1 are $D_i$ and $D_{i+1} \in \theta$. In this example, the processor 100 sets a search boundary based on a gradient of a component of a parameter as shown in Equation 1 below.

$$c_1(D_{i+1}-D_i) < \tilde{D}_{i+1} - \tilde{D}_i < c_2(D_{i+1}-D_i) \quad \text{[Equation 1]}$$

In Equation 1, $c_1$ and $c_2$ denote constants for setting a search boundary, and $\tilde{D}_i$ and $\tilde{D}_{i+1}$ denote results obtained by optimizing components of parameters corresponding to the points i and i+1.

The processor 100 may reduce a search space for optimizing a parameter by adjusting the constants $c_1$ and $c_2$, and may thus maintain a waveform (for example, a position or a direction of a pole) of a parameter obtained.

Figure 8A:
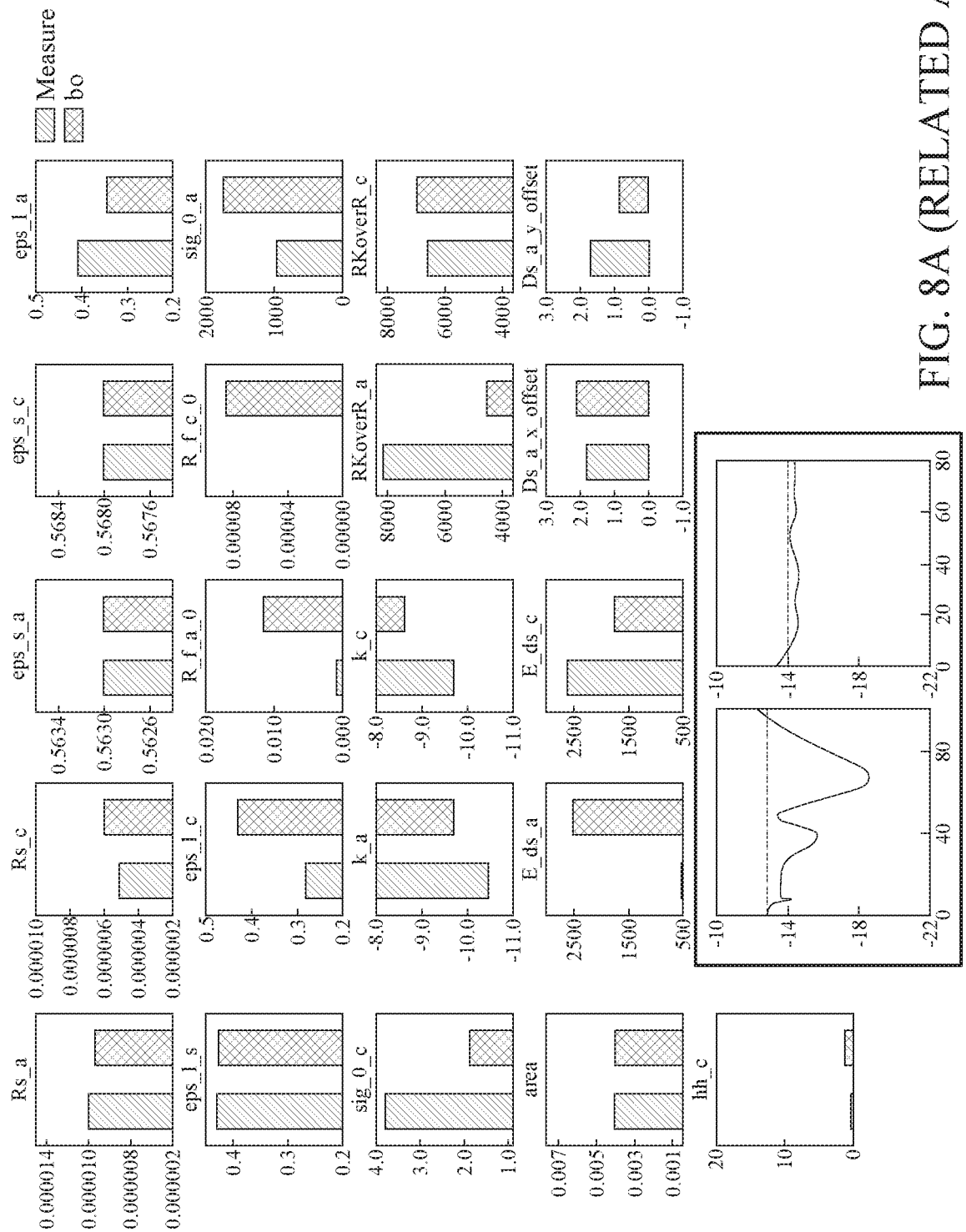
FIG. 8A illustrates a parameter of an ECT model optimized by regarding the parameter as a scalar according to related art.
Figure 8B:
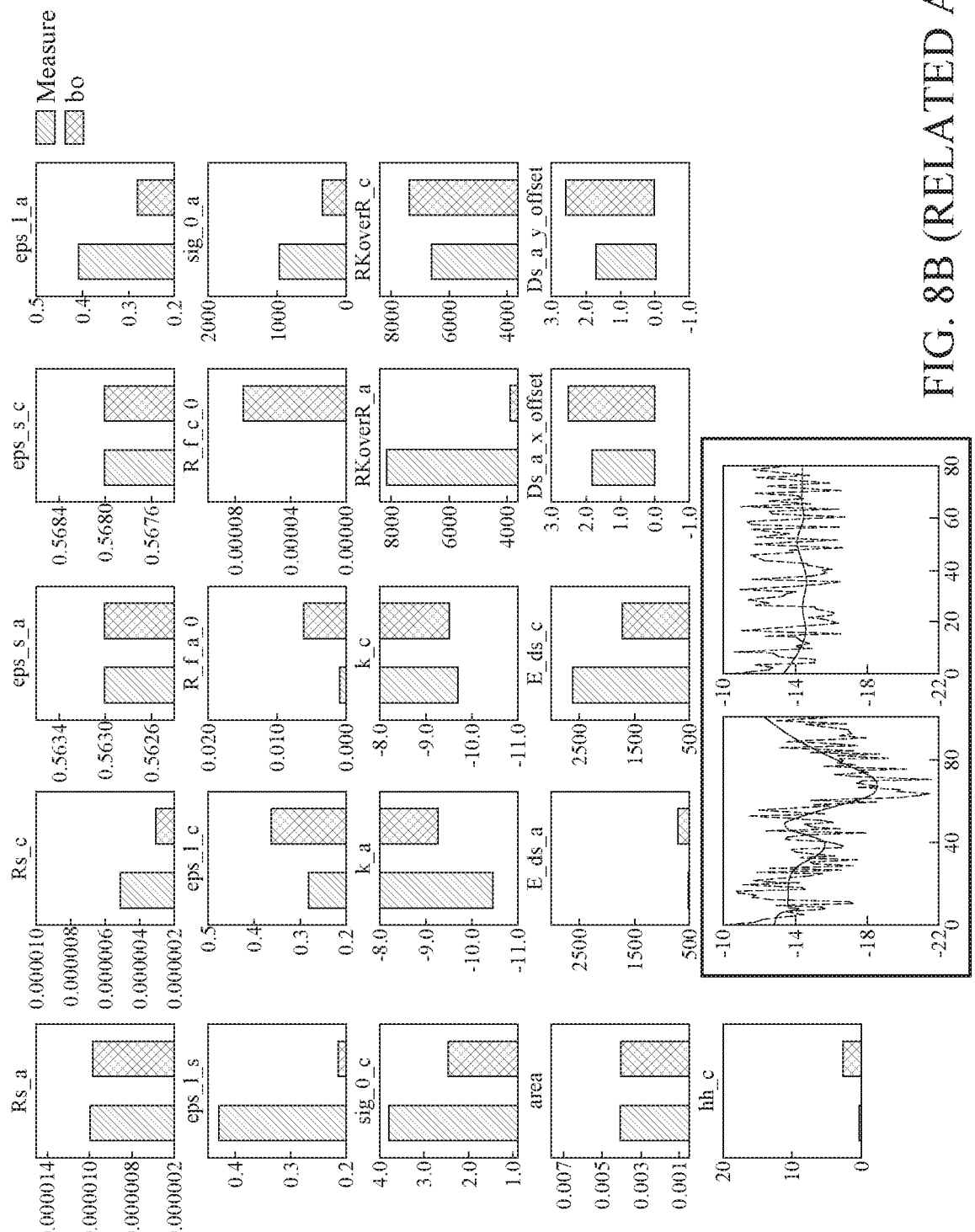
FIG. 8B illustrates a parameter of an ECT model optimized using a naïve method by regarding the parameter as a vector according to related art.
Figure 8C:
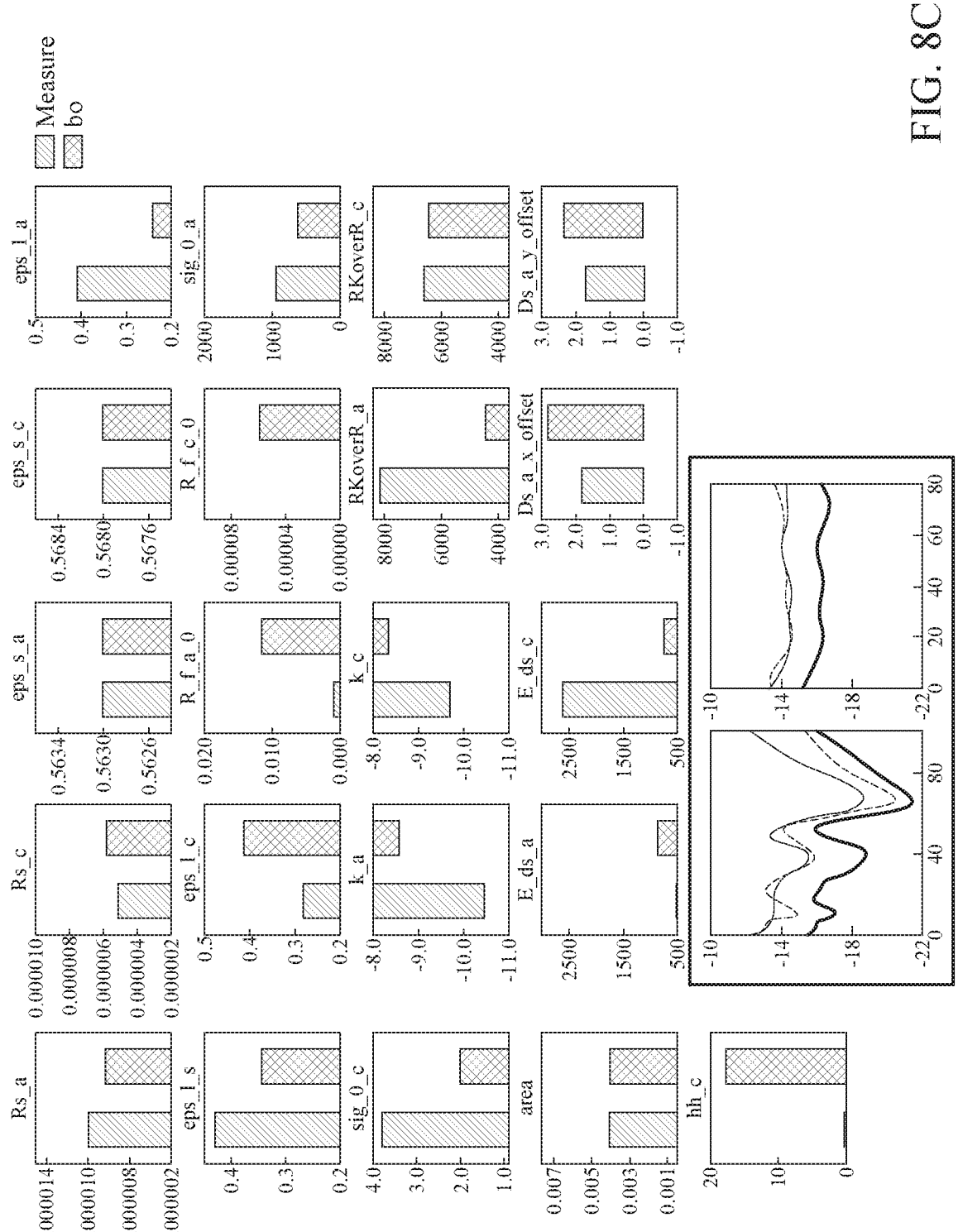
FIG. 8C illustrates an example of a parameter of an ECT model optimized by reducing a dimension of the parameter by regarding the parameter as a vector.

FIG. 8A illustrates a parameter of an ECT model optimized by regarding the parameter as a scalar according to a related art. FIG. 8B illustrates a parameter of an ECT model optimized using a naïve method by regarding the parameter as a vector according to the related art. FIG. 8C illustrates an example of a parameter of an ECT model optimized by reducing a dimension of the parameter by regarding the parameter as a vector.

Referring to FIGS. 8A through 8C, results obtained by estimating the state of the battery 30 using the battery state estimation apparatus 10 are compared to results obtained by estimating the state of the battery 30 based on a method according to the related art. FIGS. 8A and 8B illustrate results of an optimization of a parameter of an ECT model performed based on the method according to the related art, and FIG. 8C illustrates a result of an optimization of a parameter of an ECT model performed by the battery state estimation apparatus 10.

FIG. 8A illustrates a result of an optimization performed by regarding the parameter of the ECT model as a scalar. FIG. 8B illustrates a result of an optimization performed using the naïve method by regarding the parameter of the ECT model as a vector. FIG. 8C illustrates a result obtained by performing an optimization after regarding the parameter of the ECT model as a vector and reducing a dimension of the parameter and by performing an interpolation after the optimization.

Estimation results of FIGS. 8A through 8C are shown in Table 1 below.

TABLE 1

| Error | Scalar parameter (FIG. 8A) | Vector parameter + naïve optimization (FIG. 8B) | Vector parameter + Dimension reduction (FIG. 8C) |
|---|---|---|---|
| RMSE | 32.8 | 40.2 | 14.4 |
| MAE | 168.1 | 208.3 | 98.3 |

As shown in Table 1, the battery state estimation apparatus 10 constitutes the ECT model of the battery 30 using vector-type parameters, and performs an optimization by reducing a dimension of a parameter, to reduce a Root Mean Square Error ("RMSE") and a Mean Absolute Error ("MAE").

Figure 9:
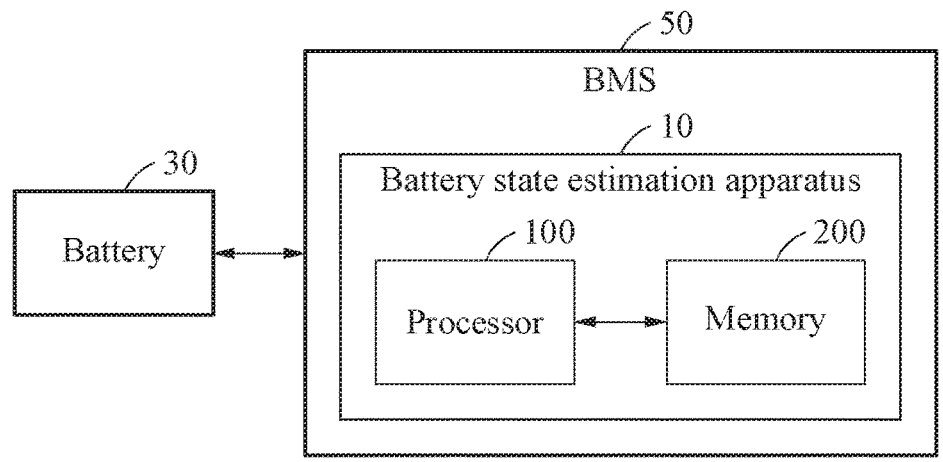
FIG. 9 illustrates an example of an implementation of the battery state estimation apparatus of FIG. 1.
Figure 10:
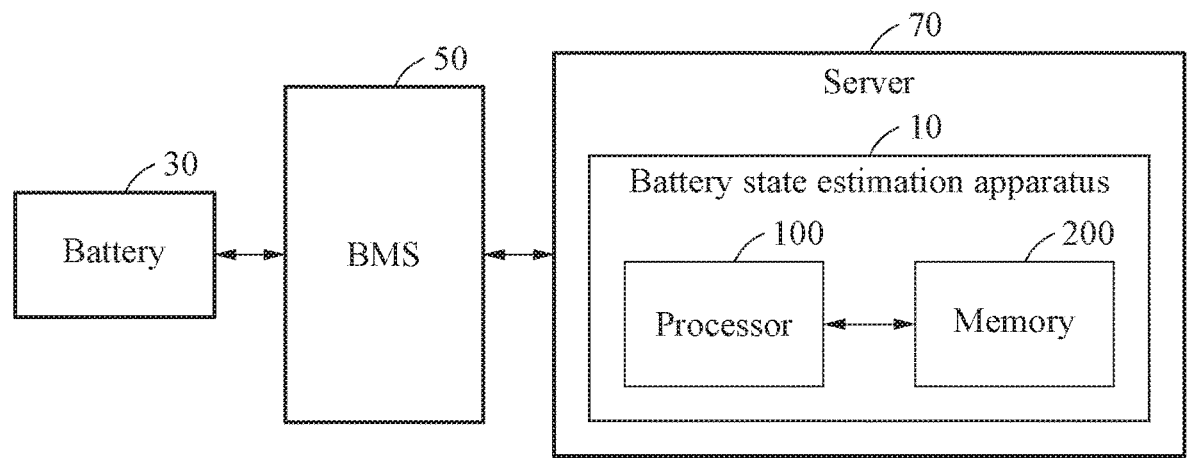
FIG. 10 illustrates another example of an implementation of the battery state estimation apparatus of FIG. 1.

FIG. 9 illustrates an example of an implementation of the battery state estimation apparatus 10 of FIG. 1, and FIG. 10 illustrates another example of an implementation of the battery state estimation apparatus 10.

Referring to FIGS. 9 and 10, a battery management system (BMS) 50 maintains an optimal state of the battery 30 while monitoring a voltage, a current and a temperature of the battery 30, and manages the battery 30 by predicting a time to replace the battery 30 and by detecting a problem occurring in the battery 30 in advance.

As shown in FIG. 9, the battery state estimation apparatus 10 may be included in the BMS 50. In another example, the battery state estimation apparatus 10 may be implemented outside the BMS 50. The battery state estimation apparatus 10 may be included in the BMS 50 to estimate the state of the battery 30 and provide an estimation result to the BMS 50.

As shown in FIG. 9, the battery state estimation apparatus 10 is included in the BMS 50 to optimize a parameter of an ECT model. The battery state estimation apparatus 10 provides the optimized parameter to the BMS 50. The battery state estimation apparatus 10 estimates the state of the battery 30 based on the optimized parameter.

As shown in FIG. 10, the battery state estimation apparatus 10 is included in a server 70 outside the BMS 50, receives information about the battery 30 from the BMS 50 and estimates the state of the battery 30 based on the received information.

The battery state estimation apparatus 10 receives information about the voltage, the current or the temperature of the battery 30 from the BMS 50, and optimizes a parameter of the ECT model.

Also, the battery state estimation apparatus 10 transmits the optimized parameter to the BMS 50, estimates the state of the battery 30 and transmits the estimated state of the battery 30 to the BMS 50.

Figure 11:
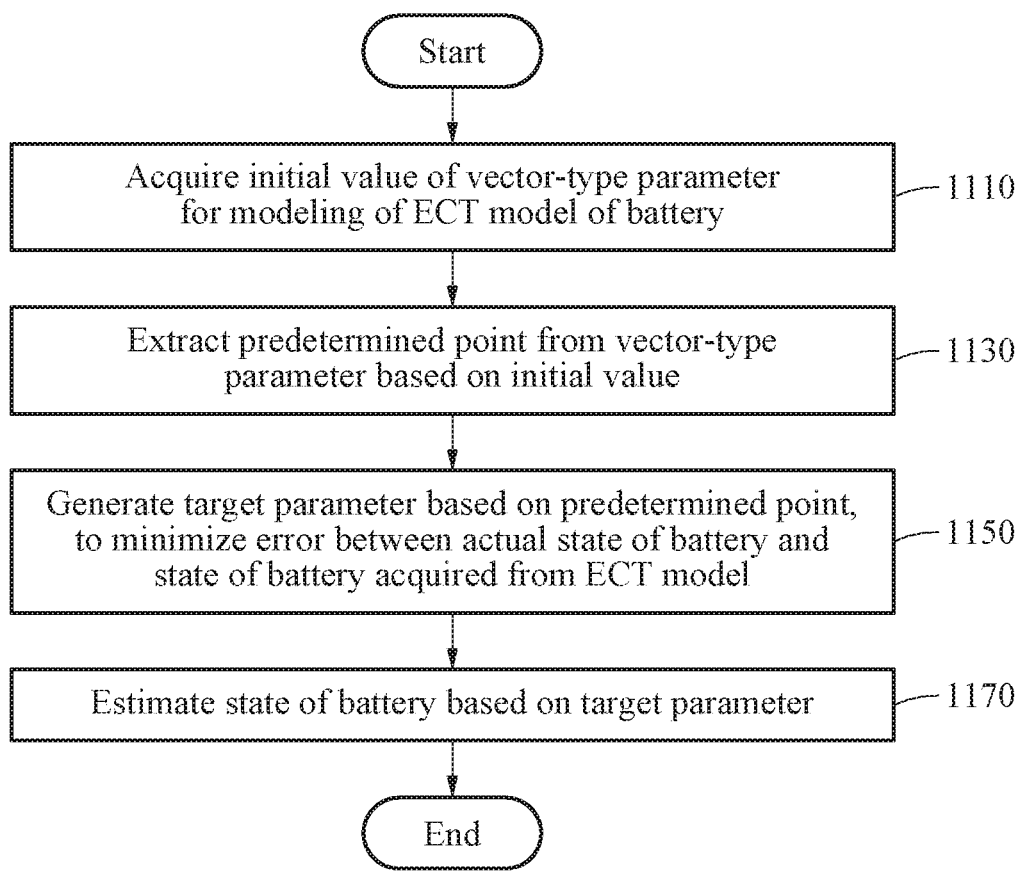
FIG. 11 is a flowchart illustrating an example of an operation of the battery state estimation apparatus of FIG. 1.

FIG. 11 is a diagram illustrating an example of an operation of the battery state estimation apparatus 10 of FIG. 1. The operations in FIG. 11 may be performed in the sequence and manner as shown, although the order of some operations may be changed or some of the operations omitted without departing from the spirit and scope of the illustrative examples described. Many of the operations shown in FIG. 11 may be performed in parallel or concurrently. The blocks of the battery state estimation process of FIG. 11, and combinations of the blocks, are performed by a battery state estimation apparatus. In an example, the battery state estimation apparatus is implemented by special purpose hardware-based computer, and devices such as a processor, that perform the specified functions, or combinations of special purpose hardware and computer instructions included in the battery state estimation apparatus. In addition to the description of FIG. 11 below, the descriptions of FIGS. 1-10 is also applicable to FIG. 11 and are incorporated herein by reference. Thus, the above description may not be repeated here.

Referring to FIG. 11, in operation 1110, the processor 100 acquires an initial value of a vector-type parameter for modeling of the ECT model of the battery 30. The vector-type parameter has a dimension based on a stoichiometry of an electrode during charging and discharging of the battery 30.

In operation 1130, the processor 100 extracts a predetermined point from the vector-type parameter based on the acquired initial value. The processor 100 may extract the predetermined point based on a value obtained by differentiating the vector-type parameter at least once with respect to a stoichiometry.

The processor 100 may extract a point at which the value obtained by differentiating the vector-type parameter at least once is a predetermined value, as the predetermined point. The predetermined value may be, for example, zero.

In operation 1150, the processor 100 generates a target parameter based on the extracted point, to minimize an error between an actual state of the battery and a state of the battery acquired from the ECT model.

The processor 100 may set a search boundary of a component of the vector-type parameter. The processor 100 may set a search boundary of a value of a component of a parameter. Also, the processor 100 may set a search boundary based on a gradient for a stoichiometry of the component of the parameter.

The processor 100 may generate the target parameter based on the set search boundary.

The processor 100 may acquire the state of the battery 30 from the ECT model using a parameter corresponding to the predetermined point.

The processor 100 may calculate the error between the actual state of the battery 30 and the state of the battery 30 acquired from the ECT model.

The processor 100 may generate the target parameter to minimize the error between the actual state of the battery 30 and the state of the battery 30 acquired from the ECT model.

The processor 100 may generate a set of parameters used in the ECT model. The processor 100 may generate a candidate parameter based on the set of the parameters. For example, when an error calculated based on the candidate parameter is minimized, the processor 100 may determine the candidate parameter as the target parameter.

In this example, the error may include an SSE between the actual state of the battery and the state of the battery acquired from the ECT model, for each of a plurality of points in time.

In operation 1170, the processor 100 estimates the state of the battery 30 based on the generated target parameter. The processor 100 may interpolate a parameter corresponding to each of points other than the predetermined point based on the target parameter. The processor 100 may estimate the state of the battery 30 based on the interpolated parameter.

The state of the battery 30 includes a voltage of the battery 30 with respect to a current and a temperature.

Figure 12:
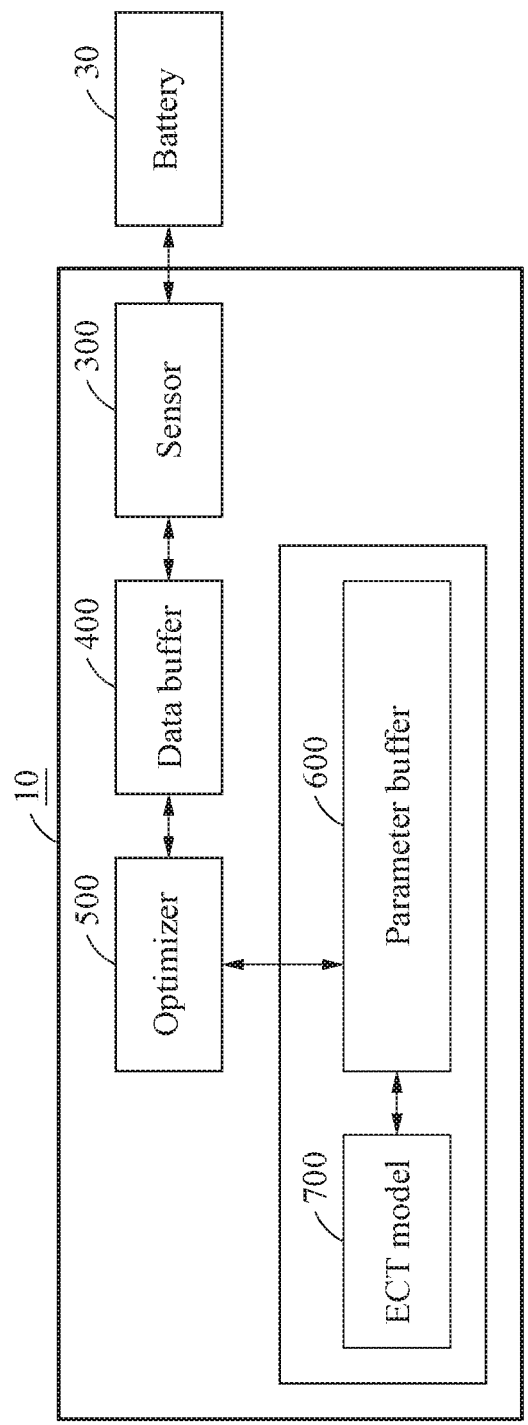
FIG. 12 illustrates another example of the battery state estimation apparatus of FIG. 1.
Figure 13:
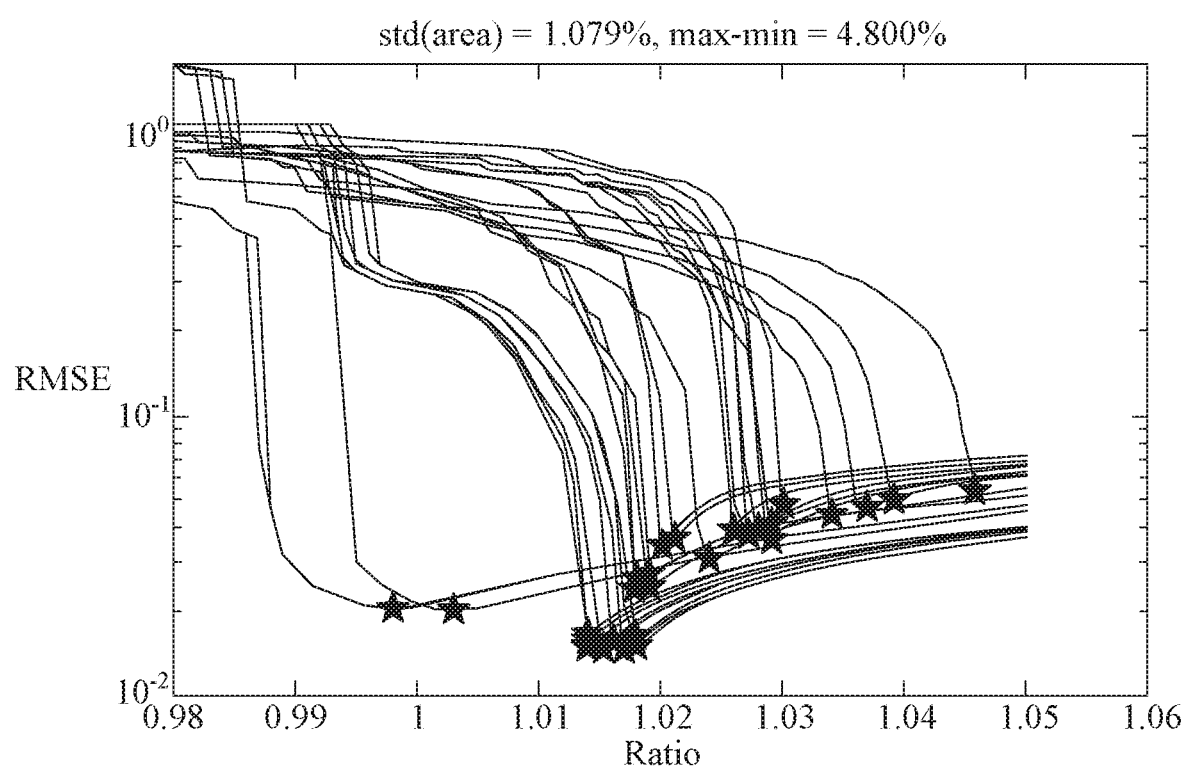
FIG. 13 illustrates an example of a parameter optimization result of the battery state estimation apparatus of FIG. 12.

FIG. 12 illustrates another example of the battery state estimation apparatus 10 of FIG. 1, and FIG. 13 illustrates an example of a result of the parameter optimization of the battery state estimation apparatus 10 of FIG. 12.

Referring to FIGS. 12 and 13, the battery state estimation apparatus 10 performs a fine optimization of a parameter of an ECT model of an estimated battery. Due to a deviation between battery cells in an actual use environment of the battery 30 including a plurality of cells, the fine optimization needs to be performed to correct the deviation. In an example, the fine optimization may be performed online.

For example, when a parameter of an ECT model of a battery is optimized, the battery state estimation apparatus 10 may perform the fine optimization based on a deviation between cells of the battery 30.

In this example, the battery state estimation apparatus 10 may perform an optimization of the parameter using the same method as those described above with reference to FIGS. 1 through 11. When the optimized parameter is deployed, the battery state estimation apparatus 10 may perform a fine optimization of the optimized parameter based on the deviation between the cells of the battery 30.

Referring to FIG. 12, the battery state estimation apparatus 10 includes a sensor 300, a data buffer 400, an optimizer 500, a parameter buffer 600, and an ECT model 700.

The sensor 300 measures an actual state of a battery cell included in the battery 30. The actual state of the battery cell includes any one or any combination of a current, a voltage and a temperature during charging and/or discharging. The sensor 300 outputs a measurement result, that is, the actual state of the battery cell to the data buffer 400.

The data buffer 400 stores the actual state of the battery cell and outputs the stored actual state of the battery cell to the optimizer 500. In an example, the data buffer 400 may be implemented as a volatile memory device or a nonvolatile memory device, as described above. The optimizer 500 performs a fine optimization of a parameter based on the actual state of the battery cell. In an example, the optimizer 500 is a "processor," which may be a hardware-implemented data processing device having a circuit that is physically structured to execute desired operations, as described above.

For example, the optimizer 500 may perform the fine optimization using an optimization algorithm requiring a low calculation cost. In an example, the optimizer 500 may perform a fine optimization of a portion of a plurality of parameters. FIG. 13 illustrates an example of a result obtained by performing a fine optimization by the optimizer 500. In FIG. 13, a star-shaped symbol represents a point at which an error calculated after the fine optimization is performed is minimized.

The optimizer 500 outputs the fine-optimized parameter to the parameter buffer 600. The parameter buffer 600 may be implemented as a volatile memory device or a nonvolatile memory device, as described above. The parameter buffer 600 outputs the fine-optimized parameter to the ECT model 700. The battery state estimation apparatus 10 estimates the state of the battery 30 based on the fine-optimized parameter.

The battery state estimation apparatus 10, optimizer 500, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the battery state estimation method. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, card type memory such as multimedia card, secure digital (SD) card, or extreme digital (XD) card, magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state estimation method comprising:
   acquiring an initial value of a vector-type parameter for modeling an electrochemical-thermal (ECT) model of a battery;
   extracting a predetermined point from the vector-type parameter based on the initial value;
   generating a target parameter based on the predetermined point, the target parameter minimizing an error between an actual state of the battery and a state of the battery acquired from the ECT model; and
   estimating the state of the battery based on the target parameter,
   wherein a dimension of the vector-type parameter depends on a stoichiometry of the battery.

2. The battery state estimation method of claim 1, wherein the dimension of the vector-type parameter is based on a stoichiometry of an electrode during charging and discharging of the battery.

3. The battery state estimation method of claim 1, wherein the extracting of the predetermined point comprises extracting the predetermined point based on a value obtained by differentiating the vector-type parameter at least once with respect to the stoichiometry.

4. The battery state estimation method of claim 3, wherein the extracting of the predetermined point based on the value obtained by differentiating the vector-type parameter at least once with respect to the stoichiometry comprises extracting a point at which the value obtained by differentiating the vector-type parameter at least once is a predetermined value.

5. The battery state estimation method of claim 4, wherein the predetermined value is zero.

6. The battery state estimation method of claim 1, wherein the generating of the target parameter comprises:
   setting a search boundary of a component of the vector-type parameter; and
   generating the target parameter based on the search boundary.

7. The battery state estimation method of claim 6, wherein the setting of the search boundary comprises setting the search boundary based on a gradient for a stoichiometry of the component of the vector-type parameter.

8. The battery state estimation method of claim 1, wherein the generating of the target parameter comprises:
   acquiring the state of the battery from the ECT model using a parameter corresponding to the predetermined point;
   calculating the error between the actual state of the battery and the state of the battery acquired from the ECT model; and
   generating the target parameter to minimize the error.

9. The battery state estimation method of claim 8, wherein the generating of the target parameter to minimize the error comprises:
   generating a set of parameters for the ECT model;
   generating a candidate parameter based on the set of the parameters; and
   determining the candidate parameter as the target parameter, in response to an error calculated based on the candidate parameter being minimized.

10. The battery state estimation method of claim 1, wherein the error comprises a sum of squared errors (SSE) between the actual state of the battery and the state of the battery acquired from the ECT model, for each of a plurality of points in time.

11. The battery state estimation method of claim 1, wherein the estimating of the state of the battery comprises:
    interpolating a parameter corresponding to each of points other than the predetermined point based on the target parameter; and
    estimating the state of the battery based on the interpolated parameter.

12. The battery state estimation method of claim 1, wherein the state of the battery comprises a voltage of the battery with respect to a current and a temperature.

13. A non-transitory computer-readable storage medium storing instructions that, when executed by a processor, cause the processor to perform the operating method of claim 1.

14. A battery state estimation apparatus comprising:
a processor configured to:
acquire an initial value of a vector-type parameter for modeling of an electrochemical-thermal (ECT) model of a battery;
extract a predetermined point from the vector-type parameter based on the initial value;
generate a target parameter based on the predetermined point, the target parameter minimizing an error between an actual state of the battery and a state of the battery acquired from the ECT model; and
estimate the state of the battery based on the target parameter,
wherein a dimension of the vector-type parameter depends on a stoichiometry of the battery.

15. The battery state estimation apparatus of claim 14, wherein the dimension of the vector-type parameter is based on a stoichiometry of an electrode during charging and discharging of the battery.

16. A battery state estimation apparatus comprising:
a processor configured to:
acquire an initial value of a vector-type parameter for modeling of an electrochemical-thermal (ECT) model of a battery;
extract a predetermined point from the vector-type parameter based on the initial value;
generate a target parameter based on the predetermined point, the target parameter minimizing an error between an actual state of the battery and a state of the battery acquired from the ECT model; and
estimate the state of the battery based on the target parameter,
wherein, for the extracting of the predetermined point, the processor is further configured to extract the predetermined point based on a value obtained by differentiating the vector-type parameter at least once with respect to a stoichiometry.

17. The battery state estimation apparatus of claim 16, wherein the processor is further configured to extract a point at which the value obtained by differentiating the vector-type parameter at least once is a predetermined value.

18. The battery state estimation apparatus of claim 17, wherein the predetermined value is zero.

19. The battery state estimation apparatus of claim 14, wherein the processor is further configured to:
set a search boundary of a component of the vector-type parameter; and
generate the target parameter based on the search boundary.

20. A battery state estimation apparatus comprising:
a processor configured to:
acquire an initial value of a vector-type parameter for modeling of an electrochemical-thermal (ECT) model of a battery;
extract a predetermined point from the vector-type parameter based on the initial value;
generate a target parameter based on the predetermined point and a search boundary, the target parameter minimizing an error between an actual state of the battery and a state of the battery acquired from the ECT model; and
estimate the state of the battery based on the target parameter, wherein, for the generation of the target parameter, the processor is further configured to set the search boundary based on a gradient for a stoichiometry of a component of the vector-type parameter.

21. The battery state estimation apparatus of claim 14, wherein the processor is further configured to:
acquire the state of the battery from the ECT model using a parameter corresponding to the predetermined point;
calculate the error between the actual state of the battery and the state of the battery acquired from the ECT model; and
generate the target parameter to minimize the error.

22. The battery state estimation apparatus of claim 21, wherein the processor is further configured to:
generate a set of parameters for the ECT model;
generate a candidate parameter based on the set of the parameters; and
determine the candidate parameter as the target parameter, in response to an error calculated based on the candidate parameter being minimized.

23. The battery state estimation apparatus of claim 14, wherein the error comprises a sum of squared errors (SSE) between the actual state of the battery and the state of the battery acquired from the ECT model, for each of a plurality of points in time.

24. The battery state estimation apparatus of claim 14, wherein the processor is further configured to:
interpolate a parameter corresponding to each of points other than the predetermined point based on the target parameter; and
estimate the state of the battery based on the interpolated parameter.

25. The battery state estimation apparatus of claim 14, wherein the state of the battery comprises a voltage of the battery with respect to a current and a temperature.

26. The battery state estimation apparatus of claim 14, further comprising a memory configured to store the electrochemical-thermal (ECT) model and instructions executed by the processor to configure the processor to acquire an initial value, to extract the predetermined point, to generate the target parameter, and to estimate the state of the battery.

27. A battery state estimation apparatus comprising:
a sensor configured to measure an actual state of the battery;
a memory configured to store the actual sate of the battery; and
a processor-implemented optimizer configured to:
acquire an initial value of a vector-type parameter for modeling of an electrochemical-thermal (ECT) model of a battery,
extract a predetermined point from the vector-type parameter based on the initial value,
generate a target parameter based on the predetermined point and dependent on a stoichiometry-based search boundary, the target parameter minimizing an error between the actual state of the battery and a state of the battery acquired from the ECT model, and
store the target parameter in a parameter buffer; and
the parameter buffer being configured to output the target parameter to the ECT model to estimate the state of the battery.

28. The battery state estimation apparatus of claim 14, wherein the state of the battery acquired from the ECT model is a determined state of the battery, in response to the error being lesser than a threshold.

29. The battery state estimation apparatus of claim 14, wherein the processor is further configured to extract the predetermined point based on a value obtained by differentiating the vector-type parameter at least once with respect to a stoichiometry.

30. The battery state estimation apparatus of claim 29, wherein the processor is further configured to extract a point at which the value obtained by differentiating the vector-type parameter at least once is a predetermined value.

31. The battery state estimation apparatus of claim 30, wherein the predetermined value is zero.

* * * * *